(12) United States Patent
Parker

(10) Patent No.: US 7,137,052 B2
(45) Date of Patent: Nov. 14, 2006

(54) METHODS AND APPARATUS FOR MINIMIZING CURRENT SURGES DURING INTEGRATED CIRCUIT TESTING

(75) Inventor: Kenneth P. Parker, Fort Collins, CO (US)

(73) Assignee: Verigy IPco, Singapore (SG)

( * ) Notice: Subject to any disclaimer, the term of this patent is extended or adjusted under 35 U.S.C. 154(b) by 813 days.

(21) Appl. No.: 09/908,948

(22) Filed: Jul. 19, 2001

(65) Prior Publication Data
US 2003/0016042 A1    Jan. 23, 2003

(51) Int. Cl.
*G01R 31/28* (2006.01)
(52) U.S. Cl. .......................... 714/726; 326/16; 714/738
(58) Field of Classification Search ................ 714/726, 714/724, 738; 324/763, 765; 326/16
See application file for complete search history.

(56) References Cited

U.S. PATENT DOCUMENTS

| | | | | |
|---|---|---|---|---|
| 4,075,549 A | * | 2/1978 | Woodward ................... | 324/418 |
| 4,307,342 A | * | 12/1981 | Peterson ..................... | 324/767 |
| 5,187,653 A | * | 2/1993 | Lorenz ........................ | 363/89 |
| 5,490,151 A | * | 2/1996 | Feger et al. ................ | 714/727 |
| 5,831,992 A | * | 11/1998 | Wu ............................. | 714/732 |
| 6,073,261 A | * | 6/2000 | Miller ........................ | 714/731 |
| 6,320,436 B1 | * | 11/2001 | Fawcett et al. ............. | 327/158 |
| 6,389,566 B1 | * | 5/2002 | Wagner et al. .............. | 714/726 |
| 6,516,432 B1 | * | 2/2003 | Motika et al. .............. | 714/732 |
| 6,552,886 B1 | * | 4/2003 | Wu et al. ..................... | 361/56 |
| 6,606,720 B1 | * | 8/2003 | Naffziger .................... | 714/726 |
| 6,664,798 B1 | * | 12/2003 | De Jong et al. ............ | 324/763 |

OTHER PUBLICATIONS

"A Logic Design Structure for LSI Testability", E.B. Eichelberger and T.W. Williams, Proc. 14th Design Automation Conf. IEEE Pub. 77CH1216-1C, Jun. 1977, pp. 462-468.
"The Challanges of Design and Test for the World Wide Web", P. Gelsinger, Proc. International Test Conference, IEEE Pub. 99CH37034, Sep. 1999, p. 12.
"Enhancing Testability of Large; Scale Integrated Circuits Via Test Points and Additional Logic", M.J.Y. Williams and J.B. Angell, IEEE Trans. on Computers, Jan. 1973, vol. C-22, No. 1, pp. 46-60.
"Design for Testability—A Survey", T.W. Williams and K.P. Parker, Proceedings of the IEEE, Jan. 1983, vol. 71, No. 1, pp. 98-112.
"The Boundary Scan Cell", Texas Instruments, JTAG IEEE 1149. 1/P1149.4 Tutorial, Sep. 1997, Tut.I-20 Tut II-24-26.

* cited by examiner

*Primary Examiner*—Albert DeCady
*Assistant Examiner*—Esaw Abraham

(57) ABSTRACT

Structural testing can lead to high and abnormal current surges. Disclosed herein are methods for designing and testing an IC so that current surges therein may be minimized while the IC is being tested. One disclosed way to minimize current surges is by gating out shift induced node state transitions. Another disclosed way to minimize current surges is to operate two or more of an IC's scan chains in parallel, but out-of-phase.

23 Claims, 13 Drawing Sheets

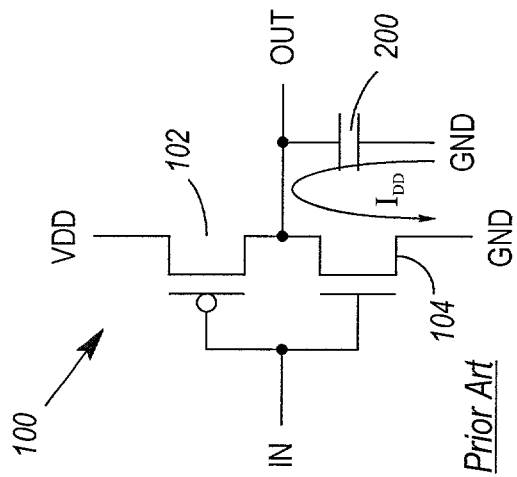
FIG. 3 *Prior Art*
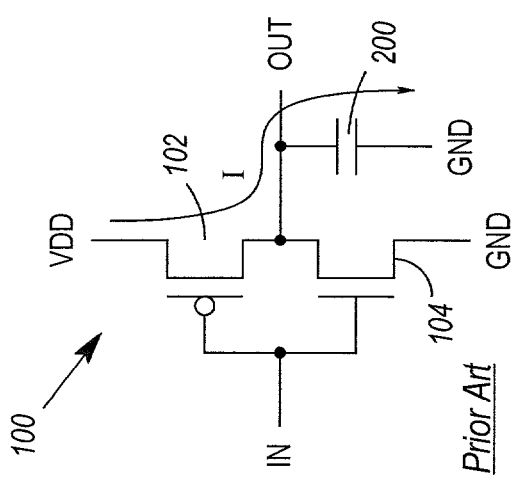
FIG. 2 *Prior Art*
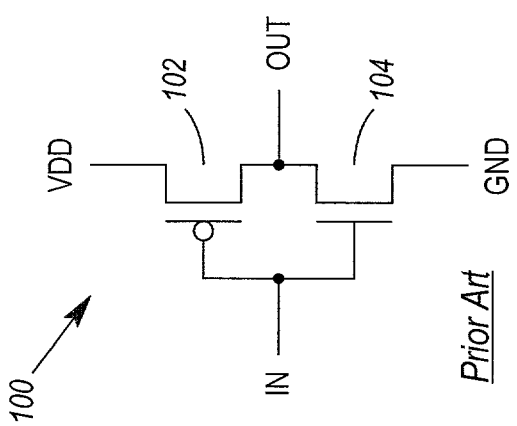
FIG. 1 *Prior Art*

METHODS AND APPARATUS FOR MINIMIZING CURRENT SURGES DURING INTEGRATED CIRCUIT TESTING

FIELD OF THE INVENTION

The invention pertains to the minimization of current surges during integrated circuit (IC) testing.

BACKGROUND OF THE INVENTION

Prior to shipping an IC to an end user, the IC must be tested to determine whether it has been manufactured correctly and is fully operational. A variety of IC testers are available for such testing. Typically, an IC tester is a very large and expensive machine which is designed to precisely position the placement of logic signal transitions at very high speeds. Most testers are aimed at creating a "functional environment" for an IC. A functional environment is one which mimics the environment in which the IC will eventually be used, to thereby demonstrate that the IC will behave as expected in that environment. A tester which creates a functional environment for an IC is referred to as a "functional" tester.

A functional tester applies a series of "test vectors" to the inputs of an IC. A test vector is a critically timed cycle of events lasting a short period of time referred to as a "vector cycle". Within a vector cycle, and at precisely calculated times, logic signal drivers in the tester apply stimulus to IC inputs. At the same or some precisely delayed time, logic signal comparators in the tester monitor responses at IC outputs. When many test vectors are executed sequentially, discrepancies between monitored and expected IC outputs, if any, are noted as IC failures. Failed ICs are then scrapped, and passed ICs are shipped to customers.

A vector cycle may last only a few nanoseconds, and a plurality of events may be timed within the cycle, with each event having a resolution in time as short as ten picoseconds. As technology continues to advance, there are increasing pressures for even shorter cycle times and finer event resolution. To complicate matters even more, functional tests are very difficult to prepare and may suffer from unknown fault coverage (i.e., unknown quality). Typically, functional tests for an IC must be created by those who designed the IC, and little automation can be used in the creation of the tests. While simulators can be used to predict how an IC will behave, simulators are often not the solution because 1) simulators often have limited fault modeling capability and, as a result, have a limited ability to determine how a test will react to "real world" faults, and 2) simulation is expensive and time-consuming, especially when generated tests are of an unknown quality.

An alternative or adjunct to functional testing is "structural" testing. Structural testing became of interest in the mid-1970's, and is discussed in detail in the paper of M. J. Y. Williams and J. B. Angell entitled "Enhancing Testability of Large-Scale Integrated Circuits Via Test Points and Additional Logic", *IEEE Trans. on Computers*, vol. C-22, no. 1 pp. 46–60 (January, 1973), and in the paper of E. B. Eichelberger and T. W. Williams entitled "A Logic Design Structure for LSI Testability", *Proc. 14th Design Automation Conf.*, IEEE Pub. 77CH1216-1C, pp. 462–468 (June, 1977), which papers are hereby incorporated by reference for all that they disclose. Initially called "scan" testing, structural testing enables the testing of structures which are deeply embedded within an IC. Rather than testing the IC's internal structure by applying stimulus to the IC's inputs, structural testing involves shifting a series of test vectors into the core of an IC, and after each test vector is shifted in, launching the test vector and capturing a response. Each response is then shifted out of the IC. In this manner, a tester can verify that all of an IC's elements are present and operational. An assumption of structural testing is that if all elements are present and operational, then the elements will contribute to performing the greater and intended functions of an IC (e.g., adding, shifting, etc.), and the IC will function as designed.

FIGS. 6 and 13 illustrate conventional ICs which incorporate one or more scan chains for the purpose of enabling structural testing of the ICs. An IC which is designed for structural testing is commonly referred to as being "designed for test", and therefore incorporates "design for test" (DFT) structures. The basic rules (i.e., DFT rules) for enabling structural testing of an IC are:

1. Implement the IC using synchronous clocked design (no asynchronous feedback).
2. In place of each register element (e.g., flip-flops) in the IC, insert a more complicated register element (i.e., a scan chain cell) having two modes of operation:
    a. A "normal mode" where the element works as a clocked memory element as required for the functionality of the IC; and
    b. A "test mode" where the element behaves as a member of a scan chain (i.e., a serial shift register chain).
3. Link the scan chain cells to form a scan chain and route appropriate signals (e.g., mode, shift and data I/O signals) to each of the cells.

If desired, structural testing can be expanded to the board level. When designing a board, a designer can link signals of each IC at the board level (e.g., mode, shift and data I/O signals) to thereby expand structural testing to the board test level. A detailed discussion of various scan chains may be found in the paper of T. W. Williams and K. P. Parker entitled "Design for Testability—A Survey", *Proceedings of the IEEE*, (Invited paper), vol. 71, no. 1, pp. 98–112 (January, 1983).

Once an IC has been made scan-testable, then its structure becomes logically equivalent to a combinational logic network surrounded by a rank of memory elements (i.e., the scan chain). Since test vectors can be shifted into and out of the memory elements of a scan chain, the elements become test resources that can 1) supply inputs to the combinational logic network, and/or 2) monitor outputs of the combinational logic network. Thus, the essentially intractable test generation problem for a sequential digital circuit of arbitrary complexity is reduced to the much simpler test generation problem for a combinational circuit, for which much automated technology exists.

Tests for a combinational circuit may be generated by an Automated Test Program Generator (ATPG) which is given the circuit description and a list of faults to be tested. Since an ATPG is typically designed to generate parallel test vectors (i.e., test vectors which can be applied to and received from the inputs and outputs of a combinational circuit), a serializer algorithm can be provided with both the parallel test vectors, and a description of the combinational circuit and scan chain, to thereby create a serial test program that can deliver the parallel test vector inputs to the combinational circuit via the scan chain. When a parallel test vector is in place, a normal clock pattern of the combinational circuit is then triggered for the purpose of launching the test vector into the combinational circuit. Finally, a response to the test vector is collected in elements of the scan chain and shifted out of the scan chain serially.

SUMMARY OF THE INVENTION

As will be described in great detail in later sections of this disclosure, structural testing can lead to high and abnormal current surges. The inventor has therefore invented methods and apparatus which minimize current surges during IC testing.

According to one preferred embodiment of the invention, a method for designing an IC comprises 1) providing the IC with a number of scan chains which provide paths through which test data may be shifted into and/or out of the IC, and 2) providing the IC with current surge minimization circuitry.

According to a second preferred embodiment of the invention, logic synthesis software comprises a number of computer readable media, and computer readable program code stored on the number of computer readable media. The computer readable program code comprises 1) program code for reading a circuit description file (wherein the circuit description file comprises data which specifies current surge minimization constraints), 2) rules and design elements for minimizing current surges in a circuit, and 3) program code for synthesizing current surge minimization circuitry using the design elements, in conformance with the current surge minimization constraints and the rules for minimizing current surges in a circuit.

According to a third preferred embodiment of the invention, an IC in which current surges may be minimized during testing comprises a plurality of interconnected circuit elements, a number of scan chains, and current surge minimization circuitry. The number of scan chains and current surge minimization circuitry may be interconnected with the plurality of interconnected circuit elements. In this manner, the number of scan chains provide paths through which test data may be shifted into and/or out of the IC, and the current surge minimization circuitry may be operated while data is being shifted through the scan chains so that current surges may be minimized within the IC.

Other preferred embodiments of the invention relate to IC testing. In a first test method, test data is shifted through a number of scan chains of an IC, and during at least a portion of the shifting, current surge minimization signals are applied to the IC.

In a second test method, test data is provided to at least two scan chains of an IC. Test data is then shifted through the at least two scan chains in parallel, but out-of-phase, while at least a portion of the test data is being provided to the at least two scan chains.

BRIEF DESCRIPTION OF THE DRAWINGS

Illustrative and presently preferred embodiments of the invention are illustrated in the drawings in which:

FIG. 1 illustrates a conventional CMOS inverter;

FIG. 2 illustrates current flow in the FIG. 1 inverter when a logic "0" is applied to the inverter's input;

FIG. 3 illustrates current flow in the FIG. 1 inverter when a logic "1" is applied to the inverter's input;

DESCRIPTION OF THE PREFERRED EMBODIMENT

Figure 4:
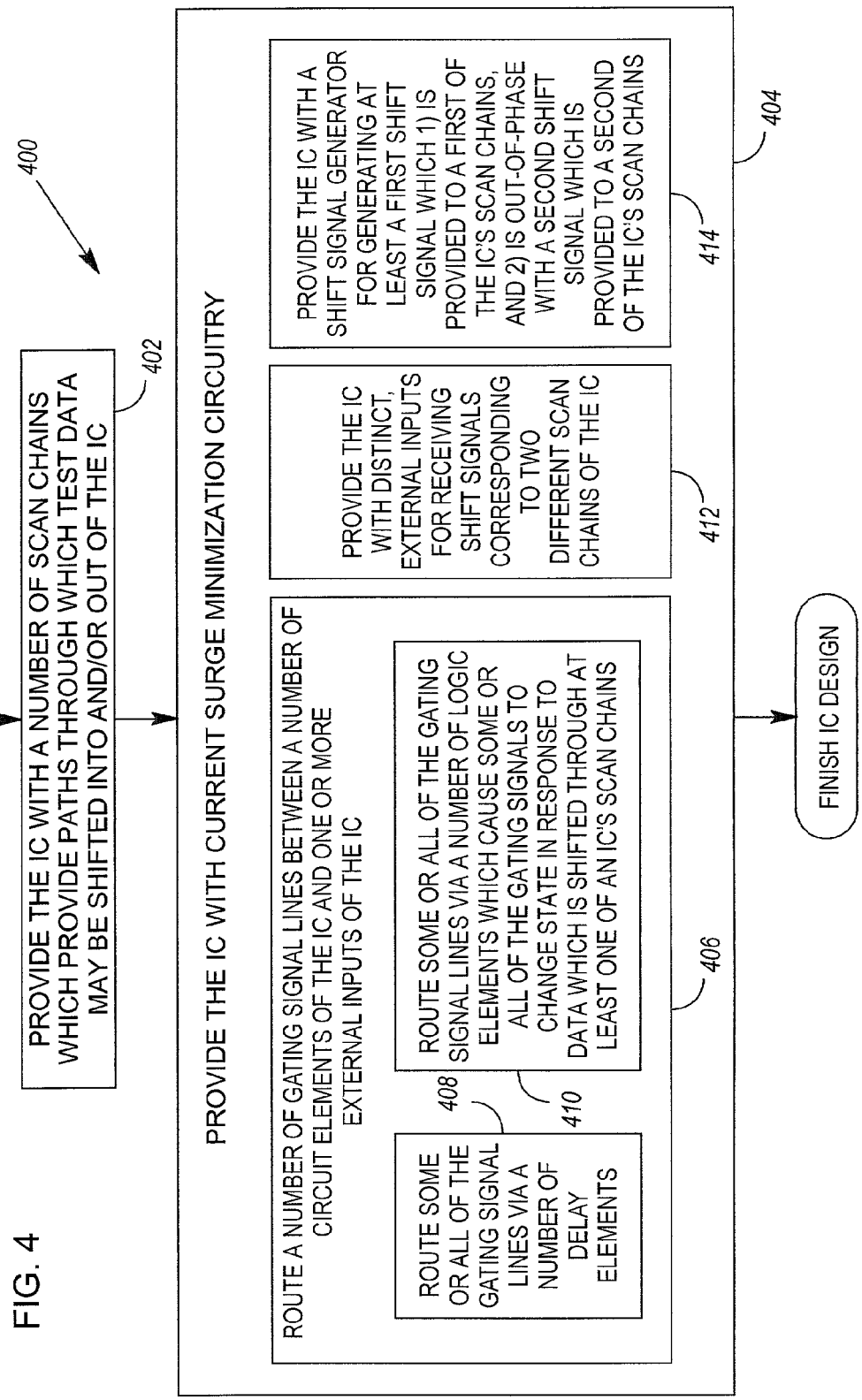
FIG. 4 illustrates a method for designing an IC.
Figure 5:
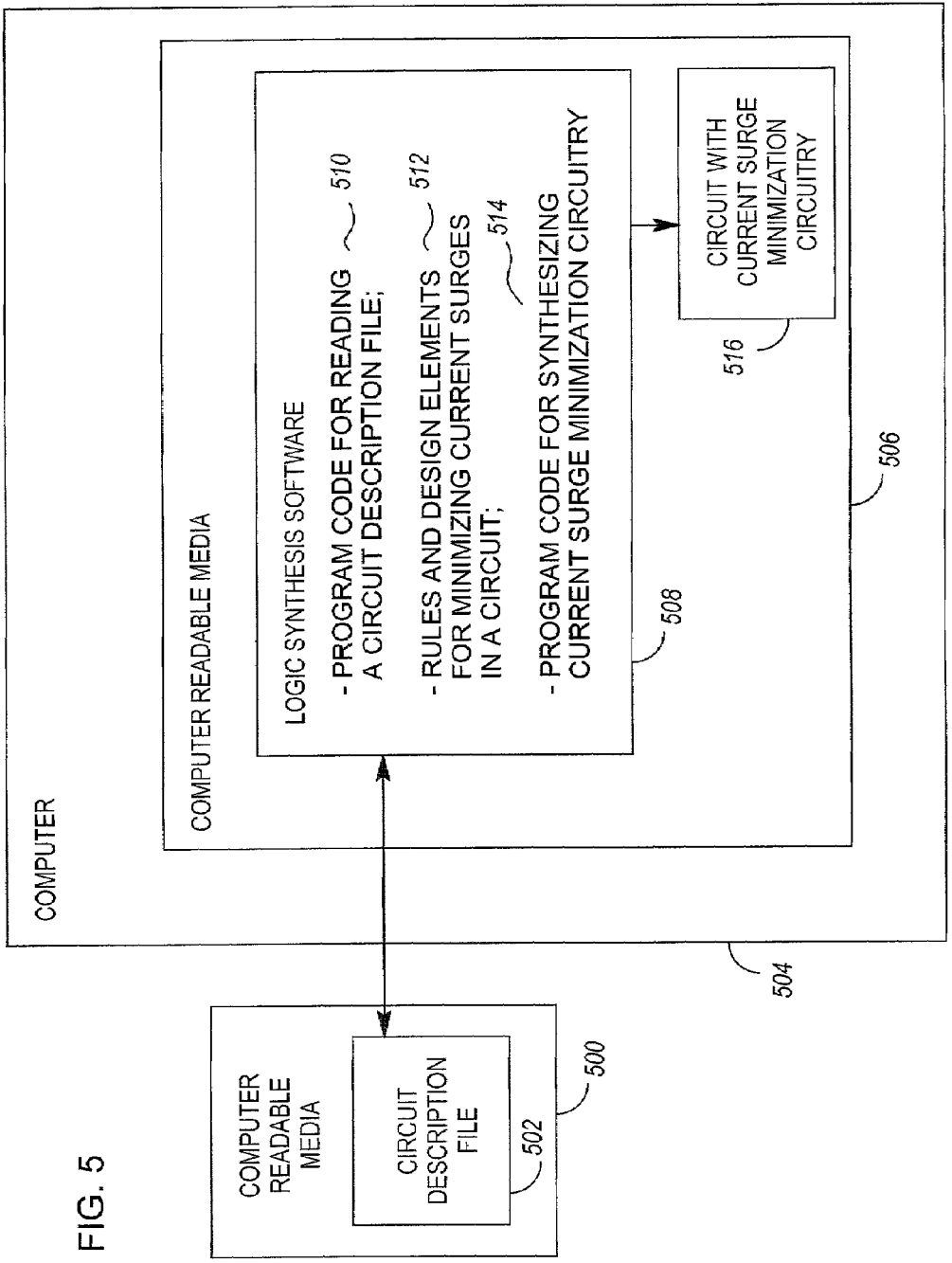
FIG. 5 illustrates a computer for executing logic synthesis software.

Modern integrated circuits typically comprise a plurality of complimentary metal-oxide semiconductor (CMOS) field-effect transistors (FETs). There are two types of CMOS FETs: the p-channel FET (PFET 102) and the n-channel FET (NFET 104), as illustrated in FIG. 1. The source and drain of a CMOS PFET 102 are typically coupled between a positive voltage (+V) and an output node (OUT). Likewise, the source and drain of a CMOS NFET 104 are typically coupled between ground (GND) and an output node (OUT). The gates of each type of FET 102, 104 may be driven or tied to a logic "0" (i.e., to turn PFETs "on" and NFETs "off"), or to a logic "1" (i.e., to turn PFETs "off" and NFETs "on").

One of ordinary skill in the art will note that FIG. 1 illustrates a CMOS inverter 100. When a logic "0" is applied to the input (IN) of the inverter 100, the inverter's PFET 102 turns on and the inverter's NFET 104 turns off, as illustrated in FIG. 2. This charges a very small parasitic capacitance 106 to +V volts so that a current, I, flows for a short time. When a logic "1" is applied to the input of the inverter 100, the inverter's PFET 102 turns off and the inverter's NFET 104 turns on, as illustrated in FIG. 3. This provides a discharge path for the parasitic capacitance 106, and a current, $I_{DD}$, flows through NFET 106.

The PFET 102 and NFET 104 are never turned on simultaneously. Thus, but for negligible leakage currents through the FETs 102, 104, the only currents which flow through the inverter 100 are those which are required to charge and discharge the parasitic capacitance 106.

In large ICs, millions of parasitic capacitances can be simultaneously charged or discharged in sync with a clock (or clocks). The summed total current surge to ground and +V at the moment that current start flowing can therefore be substantial. A generally accepted figure in the industry is that approximately 30% of the nodes of an IC will change state (i.e., charge or discharge a nodal capacitance) on any given clock cycle. In 1999, Patrick Gelsinger, then vice president and chief technology officer of Intel Corp., estimated this current surge to be on the order of 30–60 amperes per nanosecond.

During structural testing of an IC, circuitry is exercised in highly unusual ways which may never be encountered during the IC's normal operation. In fact, structural tests that excite up to 70% of an IC's nodes during a given clock cycle have been reported. The current surge which an IC is subjected to during structural testing can therefore be greater than twice that which the IC experiences during normal operation.

There are many problems associated with this increased current flow. First, current flow generates heat, and the greater the current flow, the greater the heat. Heat is already a problem for modern ICs due to 1) their ever increasing clock frequencies and transistor counts, and 2) their ever decreasing transistor sizes and spacings. Testing which increases IC current flow can therefore lead to significant thermal dissipation problems.

A second problem with increased current flow arises from parasitic resistance and inductance in an IC's power supply pathways. When subjected to current surges, the parasitic resistance and inductance can induce noise which can be perceived by a FET as a change in input voltage. Such noise can potentially lead to circuit malfunction.

In addition to the above problems, increased current flow can cause an additional problem, particularly during wafer test (i.e., when an IC is tested before it has been cut apart from other ICs fabricated on a common wafer). During wafer testing, an IC tester interfaces with an IC via a delicate fixture which brings many hundreds of signal, power, and ground connections into a small area (perhaps 1.5 cm$^2$). Contact between the fixture and the IC is made via needles which inevitably add inductance and resistance into each of the current pathways. As a result, an IC that would work fine when packaged might be dangerously close to its performance limits during wafer test, especially if supernormal current surges are experienced as a result of structural testing.

Methods and apparatus for minimizing current surges during IC testing are therefore needed. Exemplary embodiments of such methods and apparatus are illustrated in FIGS. 8–12 & 14–16.

FIG. 4 illustrates a method 400 for designing an IC. The method 400 comprises 1) providing the IC with a number of scan chains which provide paths through which test data may be shifted into and/or out of the IC 402, and 2) providing the IC with current surge minimization circuitry 404. Prior DFT methods have not specifically addressed current surge issues.

In one embodiment of the FIG. 4 method 400, current surge minimization circuitry is provided to an IC by routing a number of gating signal lines between a number of circuit elements of the IC and one or more external inputs of the IC 406.

Signals may be provided over the gating signal lines to "gate out" shift induced node state transitions during circuit testing. If the circuit elements which receive the gating signal lines are immediately downstream from a scan chain's cells, then large quantities of circuit nodes which lie downstream from the gated circuit elements can be prevented from changing state. This, in turn, minimizes current flow. Without gating, all (or many) of an IC's nodes may be subject to changing voltage on each shift of an IC's scan chain(s). Given that scan chains in modern ICs can reach lengths of many tens of thousands of cells, and thus many tens of thousands of shifts may be necessary prior to executing a test, one can appreciate that the failure to gate out shift induced node state transitions can lead to tens of thousands of dangerous current surges being imparted to an IC.

Depending on the configuration of an IC, different gating signal lines may be provided to different circuit elements. Gating control for different types of logic elements may thus be achieved.

Some or all of the gating signal lines may be routed between the circuit elements and the external inputs via a number of delay elements 408. The delay elements may serve to delay the appearance of gating signals on some lines with respect to the appearance of gating signals on other lines. In another embodiment, some or all of the gating signal lines may be routed between the circuit elements and the external inputs via a number of logic elements 410. The logic elements may cause some or all of the gating signals to change state in response to data which is shifted through at least one of an IC's scan chains. The use of delay and/or logic elements allows the control of gating signals to be moved from an IC tester to an IC, thus reducing the number of external inputs which must be provided on an IC for interfacing with an IC tester.

In another embodiment of the FIG. 4 method 400, current surge minimization circuitry is provided to an IC by providing the IC with distinct, external inputs for receiving shift signals corresponding to two different scan chains of the IC 412. The distinct, external, shift signal inputs enable the IC to receive out-of-phase shift signals for the two different scan chains. In the past, ICs have sometimes been provided with multiple scan chains that operate in sync. While this reduces the amount of time needed to shift a test vector into an IC, it does nothing to minimize current surges. However, by operating an IC's scan chains out-of-phase, current surges in an IC may be minimized while still maintaining the benefits of parallel scan chain operation.

In yet another embodiment of the FIG. 4 method 400, current surge minimization circuitry is provided to an IC by providing the IC with a shift signal generator 414. The shift signal generator generates at least a first shift signal which 1) is provided to a first of the IC's scan chains, and 2) is out-of-phase with a second shift signal which is provided to a second of the IC's scan chains. The shift signal generator merely offloads out-of-phase signal generation from an IC tester to an IC. In this manner, an IC can be provided with fewer external inputs for interfacing with an IC tester.

The above methods 400 may be implemented in a number ways. However, the methods 400 are preferably implemented by a computer 504 executing logic synthesis software 508. The logic synthesis software 508 may be embodied in computer readable program code 510–514 which is stored on a number of computer readable media 506. The computer readable media 506 may be part of and/or accessible to the computer 504. The code 510–514 itself may comprise program code 510 for reading a circuit description file 502, rules and design elements 512 for minimizing current surges in a circuit (e.g., rules for phasing scan chains and/or structural specifications for gated logic elements), and program code 514 for synthesizing current surge minimization circuitry. The circuit description file 502 may also be stored on computer readable media 500, and may comprise data which specifies current surge minimization constraints for a circuit which is described in the circuit description file 502. The program code 514 for synthesizing current surge minimization circuitry performs such synthesis using the design elements 512, in conformance with the current surge minimization constraints found in the circuit description file 502 and the rules 512 for minimizing current surges in a circuit. Preferably, the logic synthesis software 508 not only comprises program code 514 for synthesizing current surge minimization circuitry, but also program code for synthesizing the circuit 516 which is to incorporate the current surge minimization circuitry.

The current surge minimization constraints may assume a number of forms. For example, total IC current consumption below a predetermined level, regardless of the identity of a test vector, may be specified as a constraint. More likely, the ability to gate certain high-level logic structures, or the ability to phase all of an IC's scan chains, would be specified as constraints. Alternatively, the implementation of current surge minimization circuitry might be requested if projected heat dissipation, transistor count, or transistor density are above certain predetermined thresholds.

The above described methods 400, when executed by logic synthesis software 500 or other means, may be used to design a number of different ICs. Examples of such ICs are described below.

Figure 6:
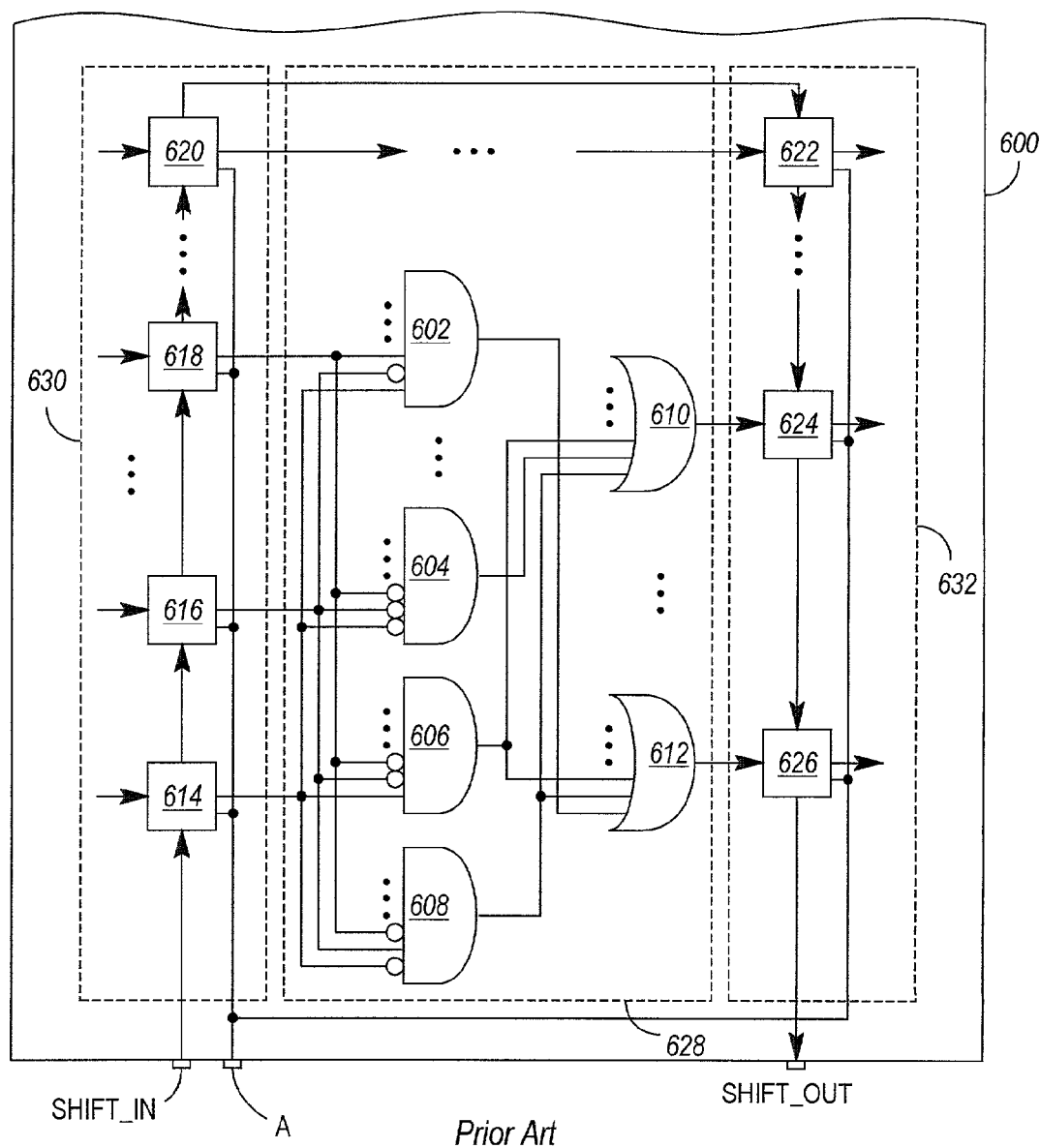
FIG. 6 illustrates an IC incorporating a scan chain.

FIG. 6 illustrates an IC 600 comprising a plurality of interconnected circuit elements 602–612. By way of example, the interconnected circuit elements 602–612 form a simple "sum of products" combinational network 628. Interconnected with the plurality of circuit elements 602–612 are a number of scan chains 614–626 (one of which is shown). The number of scan chains 602–612 provide paths through which test data may be shifted into and/or out of the IC 600. Each scan chain 614–626 comprises a plurality of cells 614–626 through which data may flow in a "normal mode", and through which data may be shifted in a "test mode". When the cells 614–626 are configured to operate in normal mode, data flows from left to right in FIG. 6. When the cells 614–626 are configured to operate in test mode, data flows from the SHIFT_IN pad to the SHIFT_OUT pad.

With respect to the combination network 628 illustrated in FIG. 6, some of the scan chain elements 614–620 function as input elements 630, while others 622–626 function as output elements 632. Note, however, that input elements 630 may also serve as output elements with respect to circuit elements located outside the boundary of the combinational network 628. Likewise, output elements 632 may serve as input elements with respect to circuit elements located outside the boundary of the combinational network 628.

Figure 13:
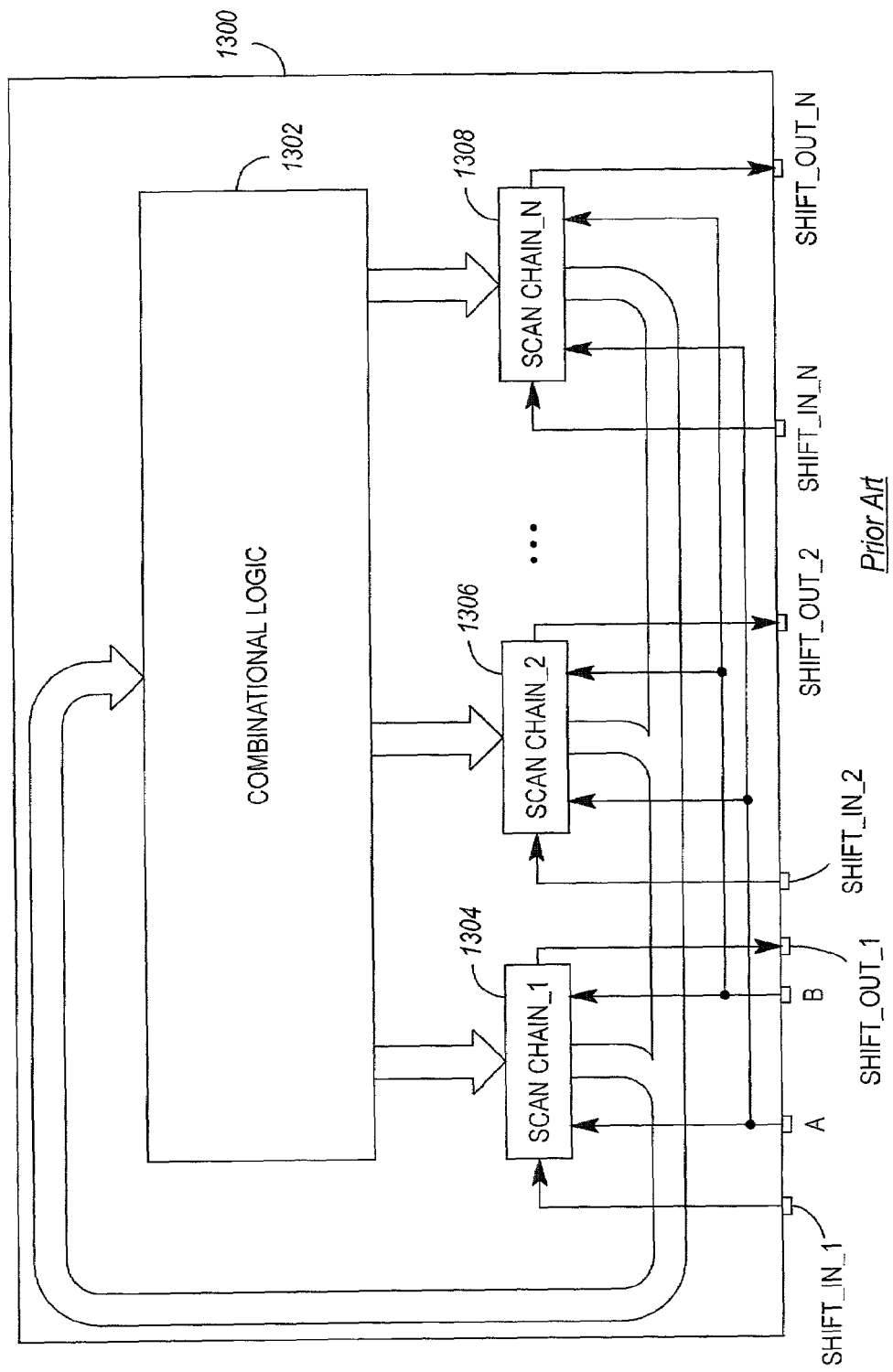
FIG. 13 illustrates an IC incorporating a plurality of scan chains.

Although the scan chain cells 614–626 are shown in FIG. 6 to form a single scan chain 614–626, the inputs and outputs of the scan chain cells 614–626 could be variously coupled so as to form one or a plurality of scan chains (e.g., see FIG. 13). A plurality of scan chains might be desirable, for example, if the length of a single scan chain would be such that its length would impose too great a time burden for shifting data into and/or out of an IC. Loading concerns might also form a catalyst for limiting the length of any one particular scan chain. For very large scale integrated (VLSI) circuits, "chain length" (i.e., the length of a scan chain) has increased to hundreds of thousands of register cells, and is increasing quickly. Breaking such scan chains into multiple smaller scan chains can therefore be advantageous.

Figure 7:
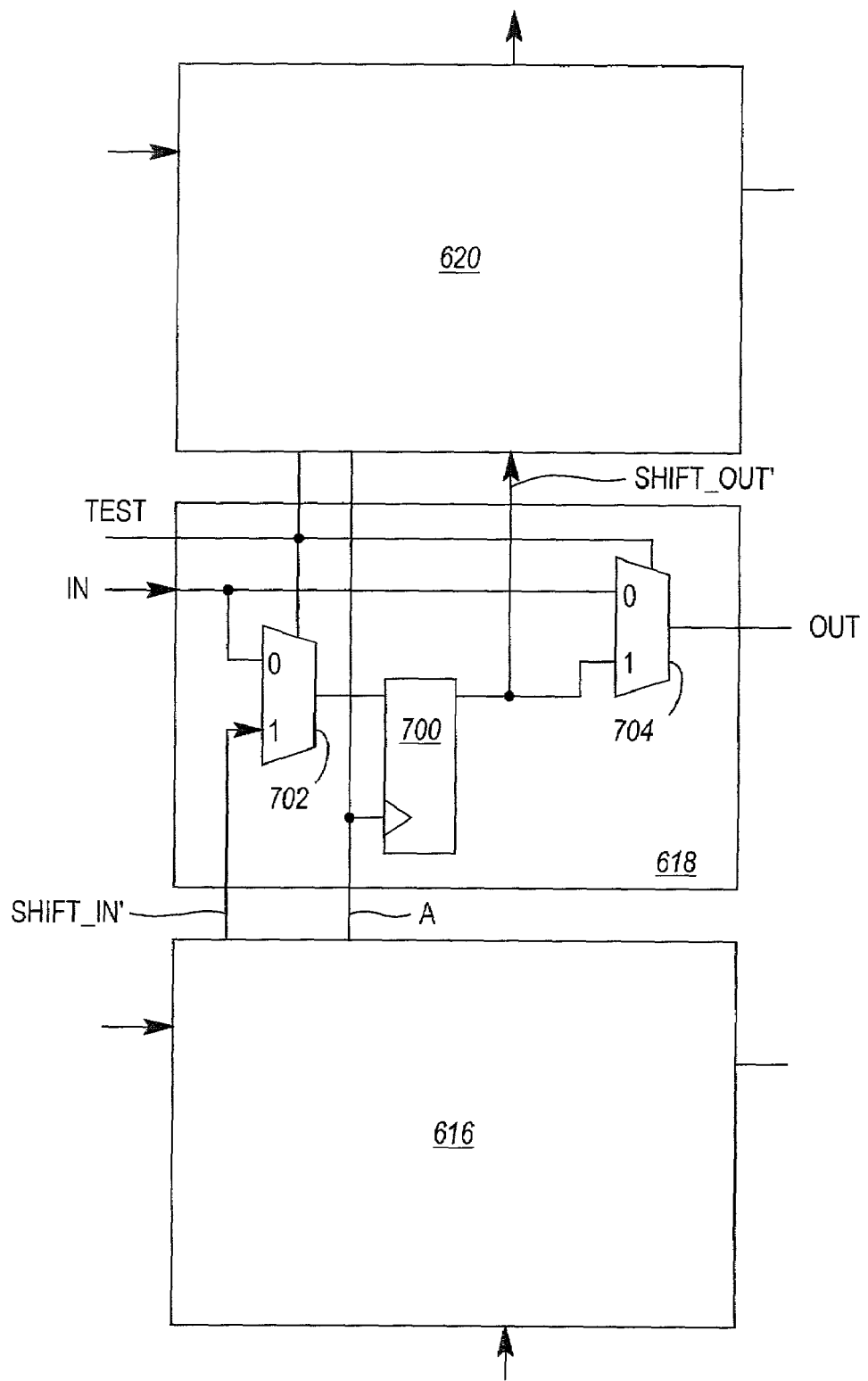
FIG. 7 illustrates an exemplary embodiment of one of the scan chain cells illustrated in FIG. 6.

The scan chain cells 614–626 illustrated in FIG. 6 may be configured in numerous ways, as is known in the art. For example, the cells could assume a capture only form, or a capture/update form. The cells could comprise single or dual latches. The cells could also be configured for level-sensitive scan design (LSSD), scan path design, scan/set design, or random-access scan design. An exemplary scan chain cell 618 is illustrated in FIG. 7. The cell 618 is of the capture/update form comprising only a single latch 700. The cell 618 is configured to operate in normal or test mode by the signal TEST (shown in FIG. 7, but not in FIG. 6). When TEST=0, the cell 618 is configured to operate in normal mode, and data flows from IN to OUT via an update multiplexer 704. While in normal mode, the cell 618 captures data as it flows from through a capture multiplexer 702 to the cell's latch 700. When TEST=1, the cell 618 is configured to operate in test mode, and data flows from SHIFT_IN to SHIFT_OUT via the capture multiplexer 702 and the latch 700. Note that in test mode, data is shifted through the cell 618 in response to a periodic shift signal, A. Note also that OUT is allowed to toggle (or ripple) as data is shifted through the cell 618. Referring to FIG. 6, one can appreciate that an IC's circuit elements 602–612 are likely to change state as test data is shifted into and/or out of the IC 600, and the outputs of each of the IC's scan chain cells 614–616 are allowed to toggle. This toggling is one of the unusual ways in which an IC 600 can be exercised during structural test. The IC 600 illustrated in FIG. 6 may therefore be modified as shown in FIG. 8.

Figure 8:
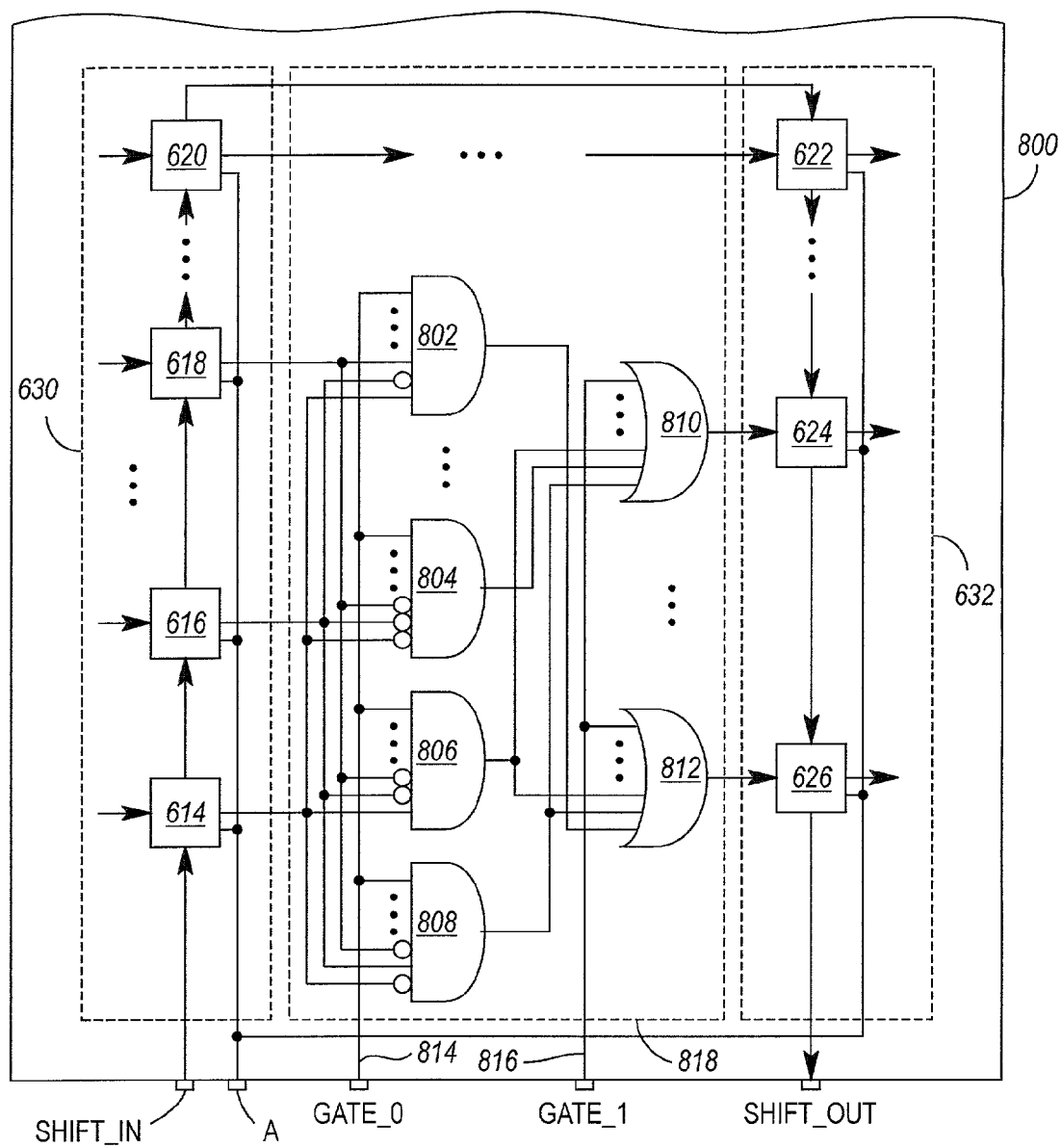
FIG. 8 illustrates a modification to the FIG. 6 IC, wherein the modification comprises the addition of current surge minimization circuitry.

The IC 800 shown in FIG. 8 is similar to the IC 600 shown in FIG. 6, but for the modification of the plurality of interconnected circuit elements 802–812 so that current surge minimization circuitry 814, 816 may be interconnected therewith. Operation of the current surge minimization circuitry 814, 816 tends to minimize current surges in the IC 800 during operation of the number of scan chains 614–626.

Figure 9:
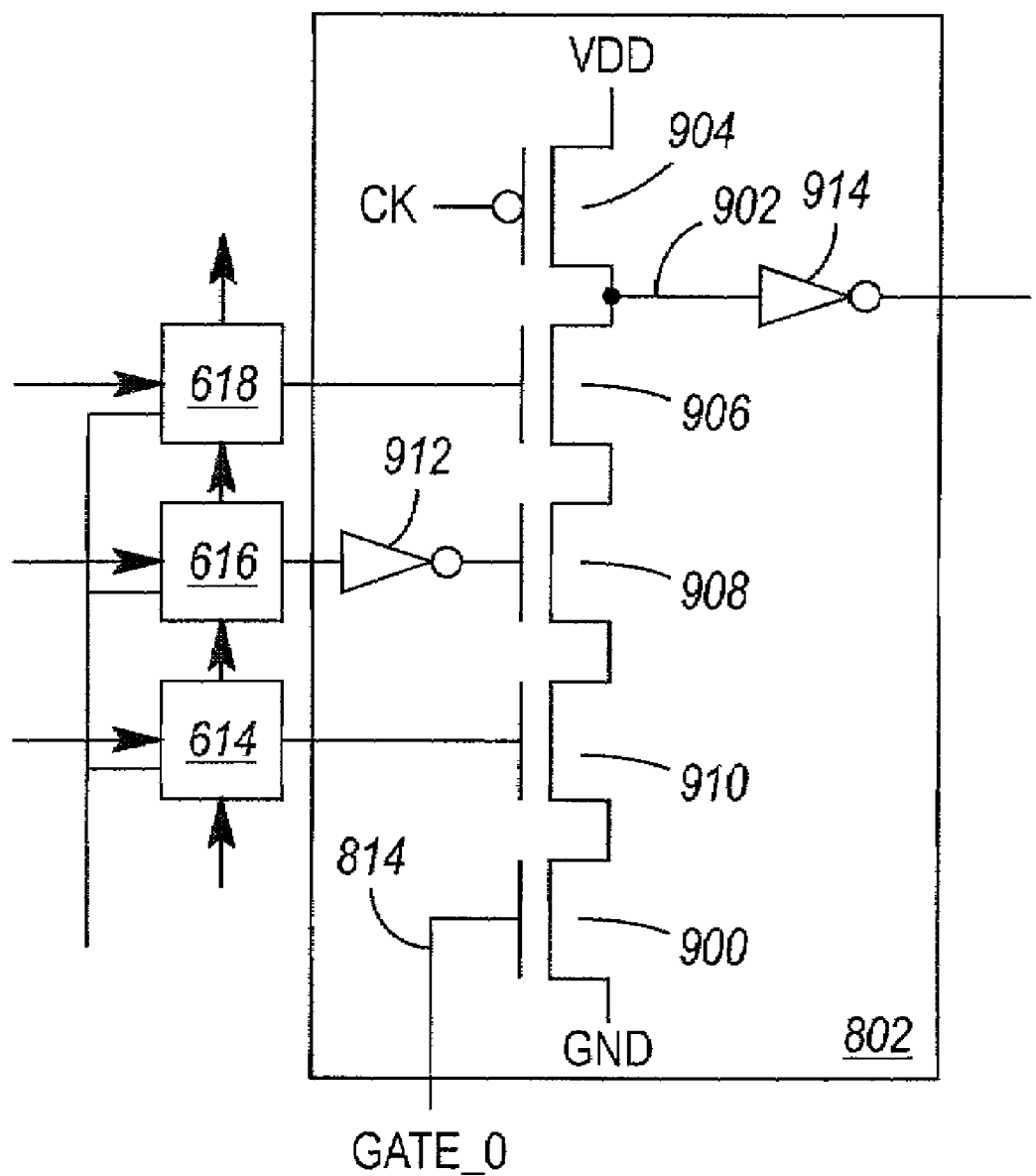
FIG. 9 illustrates an exemplary FET level schematic of a portion of the FIG. 8 IC.

In one embodiment, the current surge minimization circuitry comprises a number of transistors 900 (FIG. 9) which are coupled to ones of the plurality of interconnected circuit elements 818, wherein application of a number of gating signals to the number of transistors 900 (i.e., via gating signal lines 814, 816) disables current flow through the ones of the plurality of interconnected circuit elements 802–812. When the gating signals 814, 816 are applied during IC test, they serve to gate out shift induced node state transitions in the IC 800. In FIG. 9, an AND gate 802 from the FIG. 8 IC 800 is shown to be implemented using dynamic complimentary metal-oxide semiconductor (CMOS) logic (although the concepts disclosed herein are equally applicable to NMOS logic, PMOS logic, etc.). The AND gate 802 comprises a p-channel field effect transistor (PFET 904) which is coupled between a voltage (VDD) and a node 902. When a clock signal (CK) falls low, the node 902 is precharged to a high potential. An inverter 914 which is coupled to the node 902 therefore outputs a logic low signal. When the clock signal rises high, inputs to a number of n-channel field effect transistors (NFETs 906–910) are evaluated. If gating signal line GATE_0 814 is high, then the AND gate 802 evaluates the inputs to the AND gates inputs (i.e., the inputs coupled to scan chain elements 614 and 618 and the inverter 912). If all of the inputs are high, then the node 902 is discharged and the output of inverter 914 is pulled high. If gating signal line GATE_0 814 is low (i.e., if the current surge minimization circuitry 814, 900 is active), then the AND gate 802 will not evaluate its inputs, and current flow through the AND gate 802 is minimized. The driving of gating signal line GATE_0 814 low during operation of an IC's scan chain 614–626 will therefore gate out shift induced node state transitions.

Figure 10:
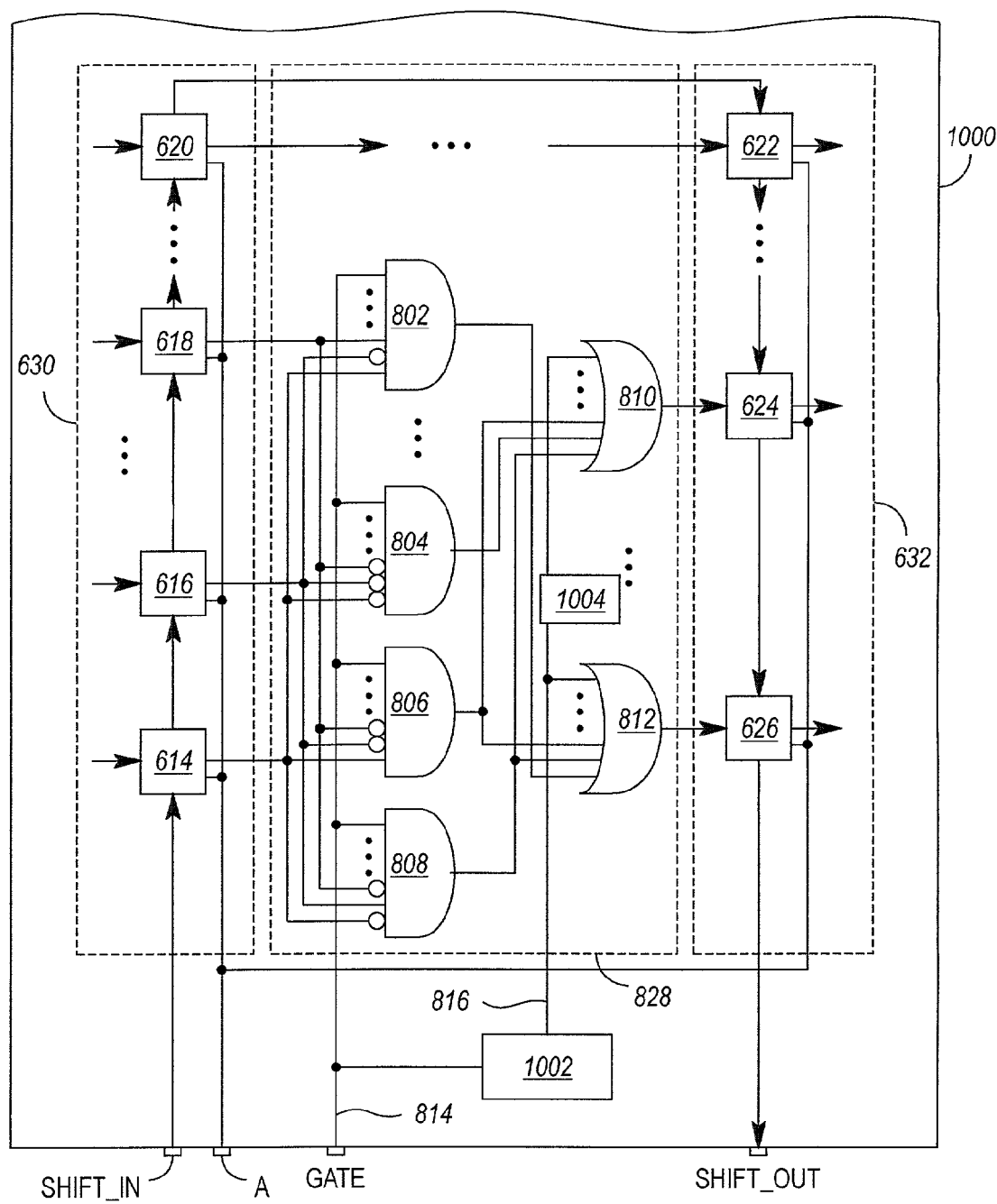
FIG. 10 illustrates an IC incorporating a first alternative to the current surge minimization circuitry shown in FIG. 8.
Figure 11:
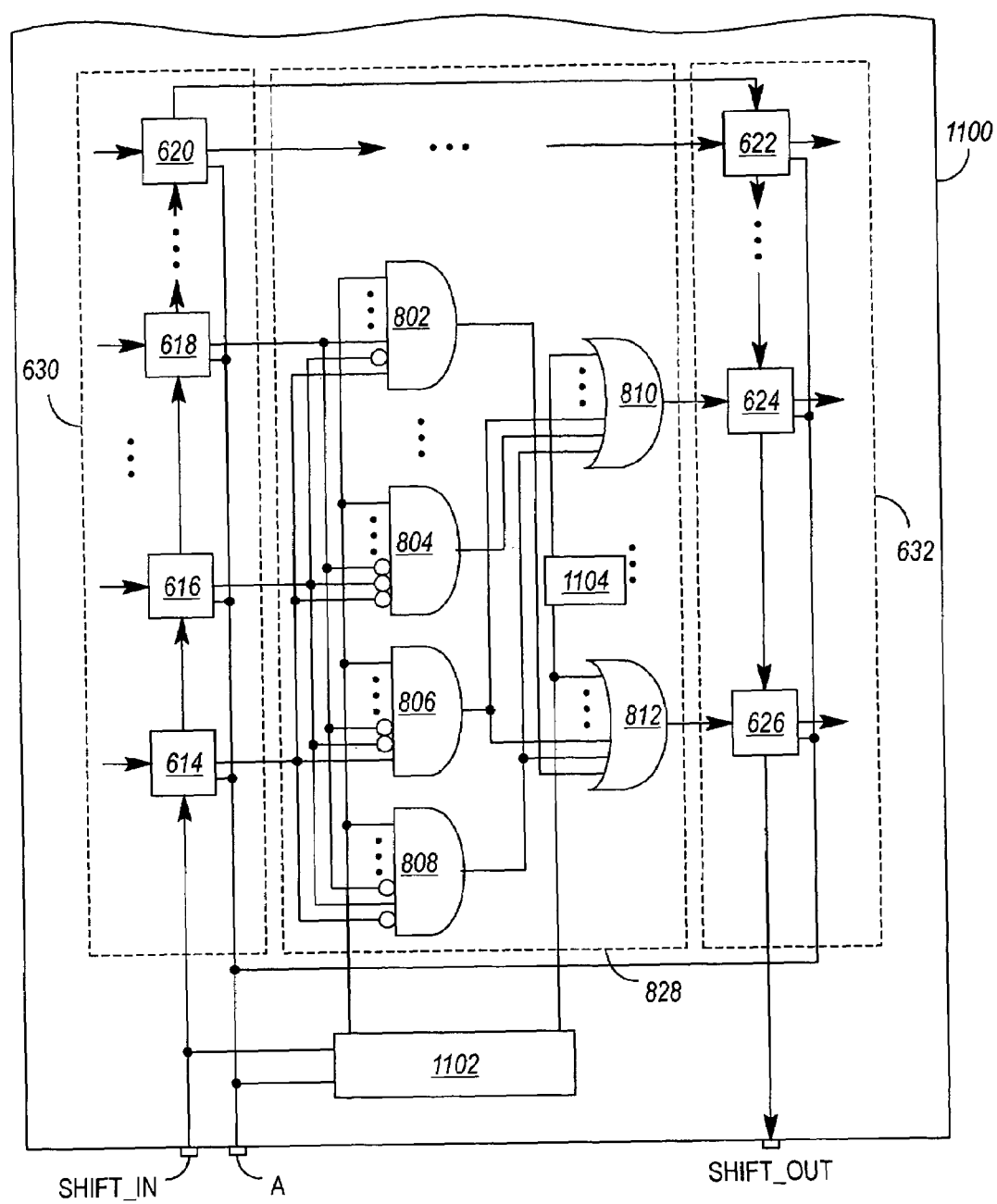
FIG. 11 illustrates an IC incorporating a second alternative to the current surge minimization circuitry shown in FIG. 8.

As shown in FIG. 8, current surge minimization circuitry may comprise an electrical network 814, 816 for connecting gates of the number of transistors 900 to one or more external inputs of the IC 800. Gating signals may then be applied to the number of transistors 900 via application of one or more signals (GATE_0, GATE_1) to one or more of the external inputs. In FIG. 8, a first external input of an IC 800 is connected to a first subset of logic gates 802–808 in the IC 800 via one gating signal line 814, and a second external input of the IC 800 is connected to a second subset of logic gates 810, 812 in the IC 800 via another gating signal line 816. In this manner, logic gates 802–808, 810, 812 may be gated in different and appropriate ways. In one embodiment (the FIG. 10 IC 1000), the electrical network 814, 816 may further comprise a number of delay elements 1002, 1004 which cause a signal applied to one of the external inputs (GATE_0) to be applied to the gates of various of the number of transistors at different times. In another embodiment (the FIG. 11 IC 1100), the electrical network 814, 816 may further comprise a number of logic elements 1102, 1104 which cause at least one of the number of gating signals 814, 816 to change state in response to data shifted through at least one of the IC's scan chains 614–626. The delay elements 1002, 1004, 1102, 1104 illustrated in FIGS. 10 & 11 are representative only, and as one skilled in the art will appreciate, delay elements could appear elsewhere in the circuits 1000, 1100 shown in FIGS. 10 & 11, such as, for example, between gates 802 and 804, between gates 804 and 806, etc. Since the GATE signal line is driven to a logic "1" during normal operation of the circuits 1000, 1100 illustrated in FIGS. 10 & 11, the delay elements 1002, 1004, 1102, 1104 only have an effect on their respective circuits 1000, 1100 during test.

Figure 12:
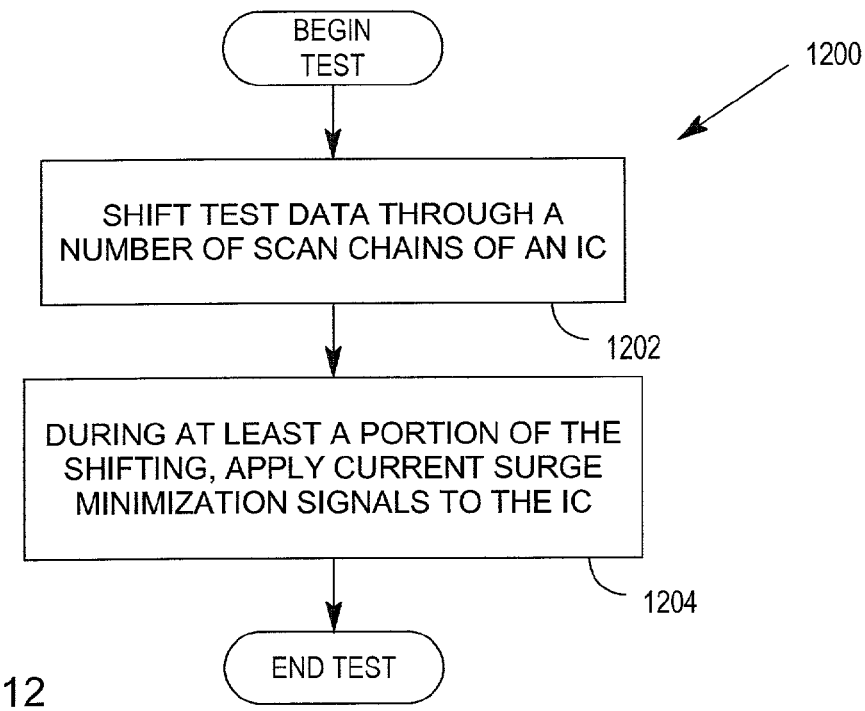
FIG. 12 illustrates a structural test method for minimizing current surges using gating signals.

A method 1200 of testing the ICs illustrated in FIGS. 8, 10 & 11, as well as other ICs, is illustrated in FIG. 12. The method 1200 comprises shifting 1202 test data through a number of scan chains 614–626 of an IC 800, 1000, 1100, and during at least a portion of the shifting, applying 1204 current surge minimization signals (e.g., GATE_0, GATE_1, GATE) to the IC 800, 1000, 1100. As has already been alluded to, the application of current surge minimization signals to an IC 800, 1000, 1100 may comprise the application of gating signals to various circuit elements 802–812 of the IC 800, 1000, 1100. In one embodiment of the FIG. 12 method, the application of current surge minimization signals to an IC 800, 1000, 1100 may comprise changing the state of at least one current surge minimization signal while the signal is being applied. Changing a signal's state during testing may be advantageous, for example, if shift induced node state transitions are to be gated out of an exclusive-OR (XOR) gate. It might also be desirable to change a gating signal's state during testing if it is determined that there is a window during testing wherein test data can propagate through some or all of an IC's circuit elements with a tolerable increase in current surge.

FIG. 13 illustrates an IC 1300 comprising a quantity of combinational logic 1302 comprising a plurality of interconnected circuit elements. Interconnected with the combinational logic 1302 are a number of scan chains 1304, 1306, 1308. As in FIG. 6, the number of scan chains 1304–1308 provide paths through which test data may be shifted into and/or out of the IC 1300. Each scan chain 1304–1308 comprises a plurality of cells (not shown) through which data may flow in a "normal mode", and through which data may be shifted in a "test mode". When the scan chains 1304–1308 are configured to operate in normal mode, data flows from top to bottom in FIG. 13. When the scan chains 1304–1308 are configured to operate in test mode, data flows from a SHIFT_IN pad to a corresponding SHIFT_OUT pad (i.e., from SHIFT_IN_1 to SHIFT_OUT_1; from SHIFT_IN_2 to SHIFT_OUT_2; and from SHIFT_IN_N to SHIFT_OUT_N).

The scan chains 1304–1308 illustrated in FIG. 13 may be configured in numerous ways, as is known in the art. By way of example, the scan chains 1304–1308 in FIG. 13 are shown to be of the dual latch variety, as indicated by the dual shift signals, A and B, which are provided to each scan chain 1304–1308.

A problem with shifting test data through the FIG. 13 IC 1300 is that even though the multiple scan chains 1304–1308 help to reduce the amount of time that it takes to complete a test cycle, the scan chains shift data in parallel, and therefore do nothing to minimize current surges in the IC 1300 during testing. The IC 1300 illustrated in FIG. 13 may therefore be modified to incorporate current surge minimization circuitry, as shown in FIG. 14.

Figure 14:
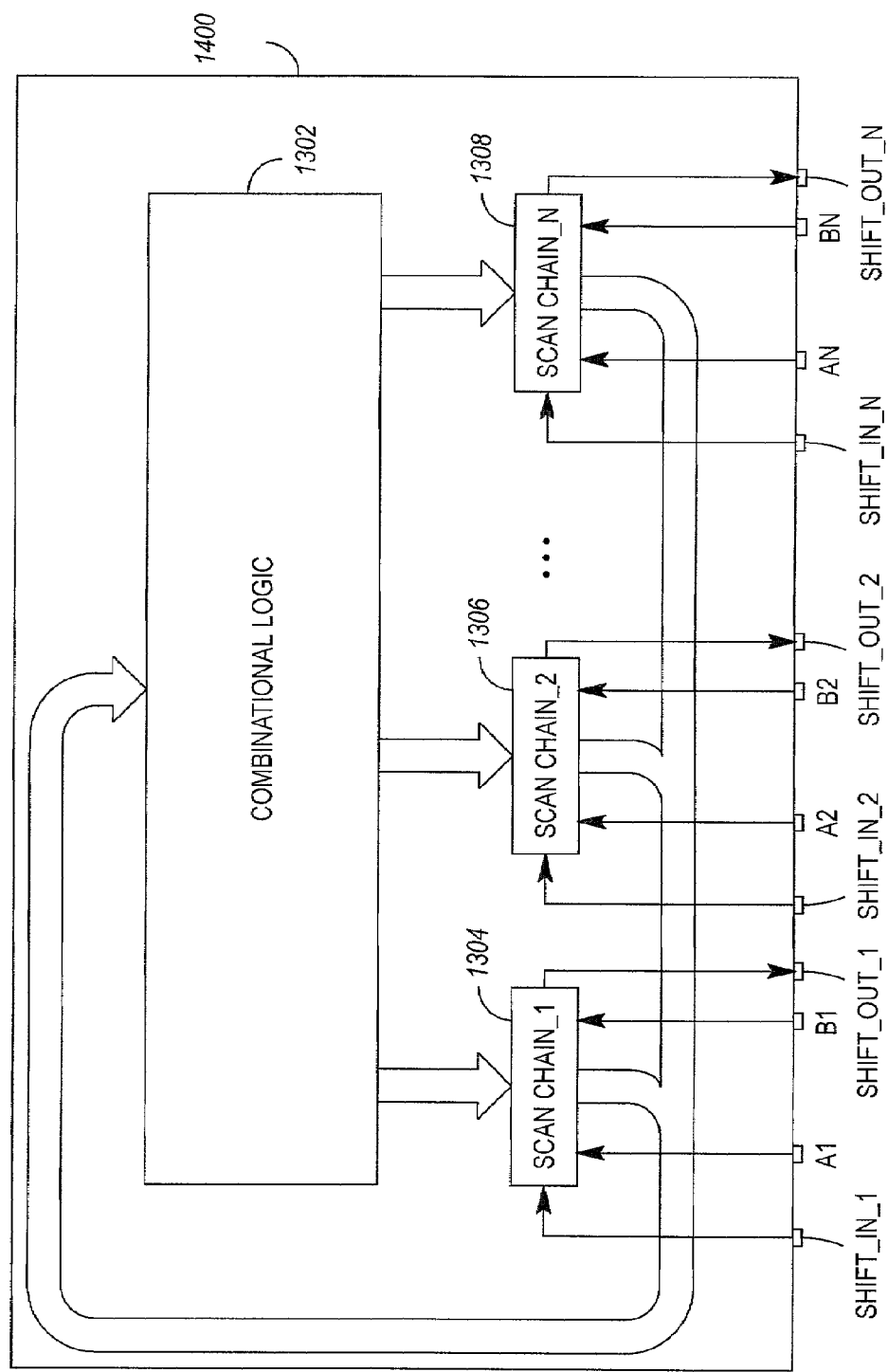
FIG. 14 illustrates a modification to the FIG. 13 IC, wherein the modification comprises the addition of current surge minimization circuitry.

The IC 1400 shown in FIG. 14 is similar to the IC 1300 shown in FIG. 13, but for the modification of the shift signal inputs to the scan chains 1304–1308. In FIG. 14, at least first and second of the scan chains 1304, 1306 respectively comprise distinct, external shift signal inputs (i.e., A1/B1 versus A2/B2). The distinct, external shift signal inputs provide a means for phasing operation of the two scan chains 1304, 1306, to thereby minimize current surges in the IC 1400. If necessary for minimizing current surges to an acceptable level, all of the scan chains 1304–1308 within an IC 1400 may be provided with distinct, external shift signal inputs (i.e., A1/B1, A2/B2 and AN/BN). Likewise, two of an IC's scan chains may share one but not another shift signal, if phasing only two shift signals provides adequate current surge minimization (e.g., two scan chains 1304, 1306 may each receive 1) a common shift signal (e.g., A1), and 2) one of a phased pair of shift signals (e.g., B1 or B2)).

Figure 15:
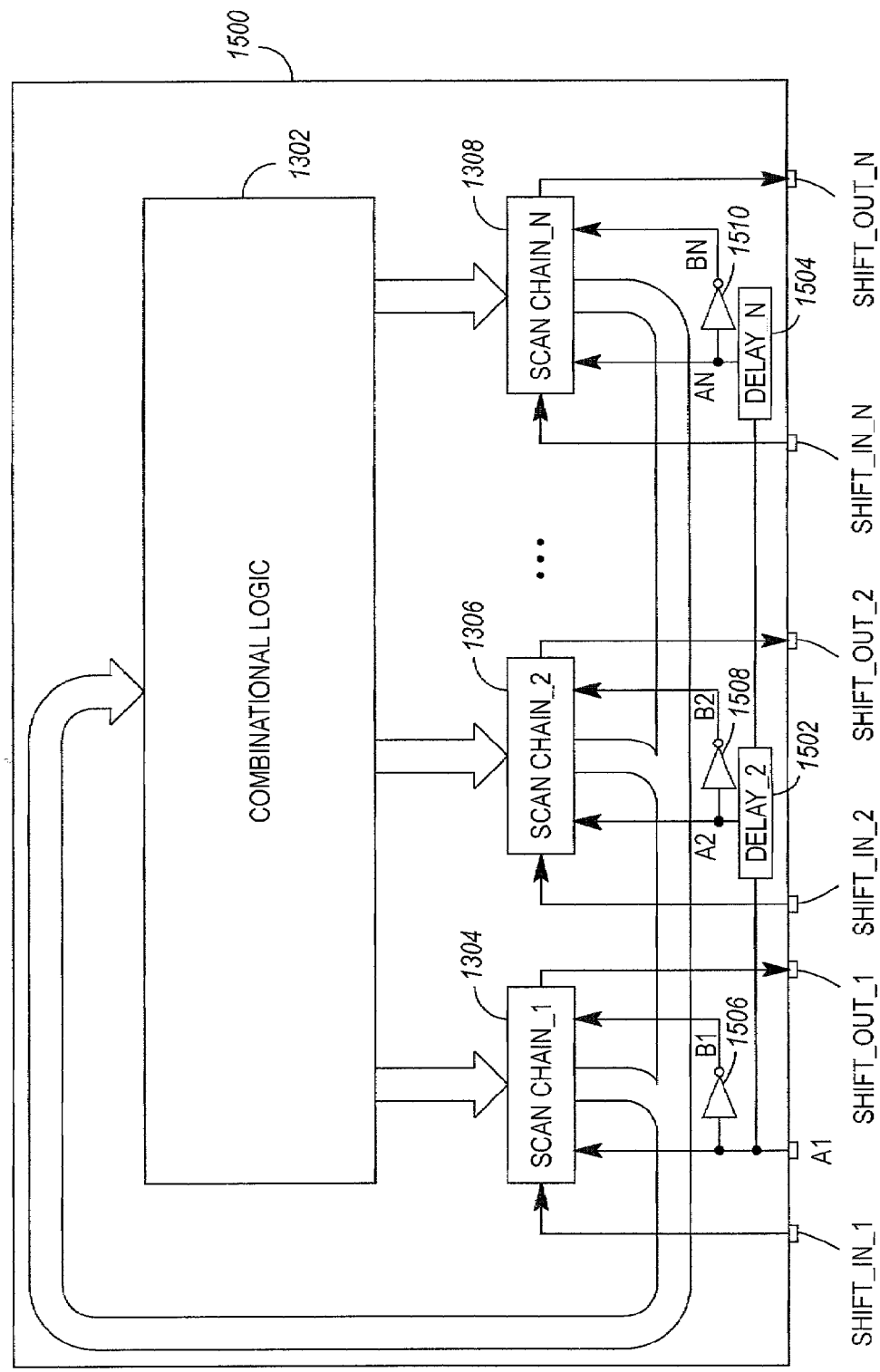
FIG. 15 illustrates an IC incorporating an alternative to the current surge minimization circuitry shown in FIG. 14.

An alternative to the FIG. 14 arrangement is illustrated in FIG. 15. In FIG. 15, first and second of an IC's scan chains 1304, 1306 respectively comprise first and second shift signal inputs (A1, A2). At least one of these shift signal inputs is coupled to a shift signal generator 1502–1510 located within the IC 1500. The shift signal generator 1502–1510 comprises a number of delay elements 1502, 1504 for delaying the generation of some shift signals (e.g., A2, B2, AN, BN) with respect to the generation of other shift signals (e.g., a first shift signal, A1). The first shift signal (A1) can then be provided to a shift signal input of a first scan chain 1304, and the delayed shift signals can be provided to shift signal inputs of other scan chains 1306, 1308. The shift signal generator 1502–1510 may also comprise inverters 1506, 1508, 1510 and/or other logic elements for providing shift signals (e.g., B1, B2, BN) to each of an IC's scan chains 1304–1308. In this manner, only one external input of an IC need be coupled to an input of the shift signal generator 1502–1510, and all of the other shift signals which are needed by an IC's scan chains 1304–1308 can be generated internally to the IC 1500.

Figure 16:
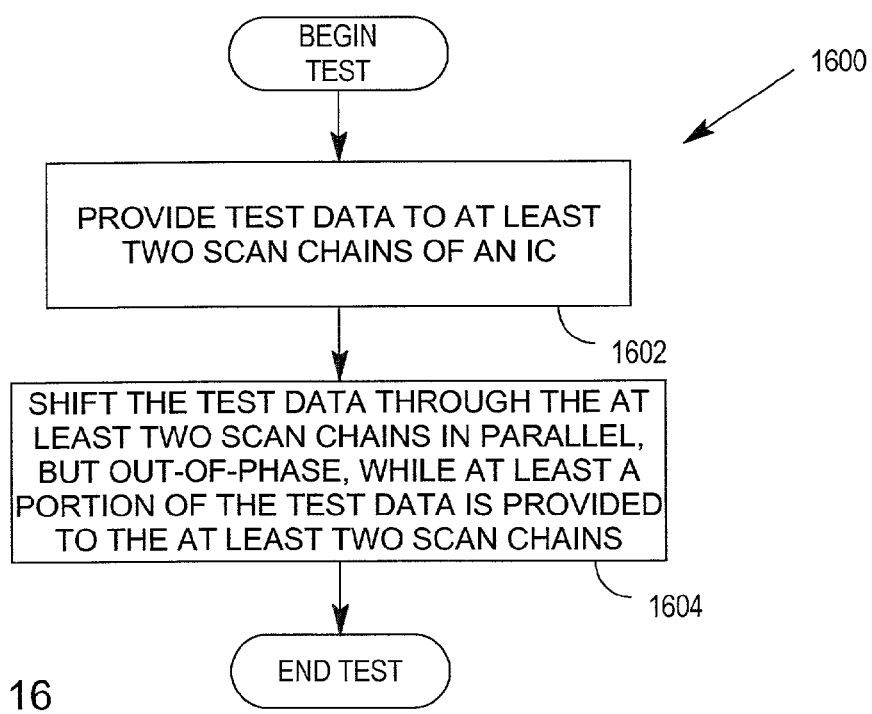
FIG. 16 illustrates a structural test method for minimizing current surges using out-of-phase shift signals.

A method 1600 of testing the ICs 1400, 1500 illustrated in FIGS. 14 & 15, as well as other ICs, is illustrated in FIG. 16. The method 1600 comprises providing 1602 test data to at least two scan chains 1304, 1306 of an IC 1400, and then shifting 1604 the test data through the at least two scan chains 1304, 1306 in parallel, but out-of-phase, while at least a portion of the test data is provided to the at least two scan chains 1304, 1306. In one embodiment of the test method, the test data may be shifted by 1) providing at least a first shift signal (e.g., A1) to a first 1304, but not a second 1306, of the at least two scan chains, and 2) providing at least a second shift signal (e.g., A2) to the second 1306, but not the first 1304, of the at least two scan chains, wherein the second shift signal is out-of-phase with the first shift signal. If more than one shift signal is provided to each of the two scan chains 1304, 1306, then preferably, all of the shift signals (e.g., A1, B1, A2, B2) which are provided to the two scan chains 1304, 1306 are out-of-phase with respect to one another.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. An integrated circuit, comprising:
   a) a plurality of interconnected circuit elements;
   b) a number of scan chains which are interconnected with the plurality of interconnected circuit elements, said number of scan chains providing paths through which test data is shifted into and/or out of the integrated circuit; and
   c) current surge minimization circuitry which is interconnected with said plurality of interconnected circuit elements, whereby operation of said current surge minimization circuitry during operation of said number of scan chains minimizes current surges in said integrated circuit.

2. An integrated circuit as in claim 1, wherein:
   a) said current surge minimization circuitry comprises a number of transistors which are coupled to ones of said plurality of interconnected circuit elements; and
   b) said number of transistors receive a number of gating signals during operation of said number of scan chains, which number of gating signals disable current flow through the ones of said plurality of interconnected circuit elements.

3. An integrated circuit as in claim 2, wherein the current surge minimization circuitry comprises an electrical network connecting gates of the number of transistors to one or more external input of the integrated circuit, wherein the number of gating signals is applied to the number of transistors via application of one or more signals to said one or more external inputs.

4. An integrated circuit as in claim 3, wherein the electrical network comprises a number of delay elements which cause a signal applied to one of said external inputs to be applied to the gates of various of said number of transistors at different times.

5. An integrated circuit as in claim 3, wherein the electrical network comprises a number of logic elements which cause at least one of said number of gating signals to change state it response to data shifted through at least one of said number of scan chains.

6. An integrated circuit as in claim 1, wherein:
   a) the number of scan chains comprises at least first and second scan chains; and
   b) the current surge minimization circuitry comprises a shift signal generator comprising a number of delay elements for delaying generation of a second shift signal with respect to generation of a first shift signal, said first shift signal being provided to a shift signal input of said first scan chain, and said second shift signal being provided to a shift signal input of said second scan chain.

7. An integrated circuit as in claim 1, wherein:
   a) the number of scan chains comprises at least first and second scan chains; and
   b) the current surge minimization circuitry comprises a shift signal generator comprising a number of delay elements for delaying generation of a second shift signal with respect to generation of a first shift signal, said first shift signal being provided to a shift signal input of said first scan chain, and said second shift signal being provided to a shift signal input of said second scan chain.

8. An Integrated circuit as in claim 7, wherein only one external input of said integrated circuit is coupled to a shift signal input of said shift signal generator.

9. An integrated circuit, comprising:
   a) a plurality of interconnected circuit elements;
   b) a number of scan chains which are interconnected with the plurality of interconnected circuit elements, said number of scan chains providing paths through which test data is shifted into and/or out of the integrated circuit; and
   c) means for minimizing current surges in said integrated circuit as said number of scan chains shift test data into and out of said plurality of interconnected circuit elements.

10. An integrated circuit as in claim 9, wherein said means for minimizing current surges comprises means for gating out shift induced node state transitions in said integrated circuit as said number of scan chains shift test data.

11. An integrated circuit as in claim 9, wherein said means for minimizing current surges comprises means for phasing operation of at least two of said number of scan chains.

12. A computer program product, comprising:
   a computer usable medium having computer readable program code means embodied therein for synthesizing current surge minimization circuitry, the computer readable program code comprising:
   i) program code for reading a circuit description file, the circuit description file comprising data which specifies current surge minimization constraints for a circuit which is described in the circuit description file, at least some of said current surge minimization constraints being defined for operation of the circuit during operation of at least one scan chain of the circuit;
   ii) rules and design elements for minimizing current surges in a circuit; and
   iii) program code for synthesizing current surge minimization circuitry using said design elements, in conformance with said current surge minimization constraints and said rules for minimizing current surges in a circuit.

13. A computer program product as in claim 12, wherein the computer readable program code further comprises program code for synthesizing said circuit.

14. A method of designing an integrated circuit, comprising:
   a) providing the integrated circuit with a number of scan chains which provide paths through which test data is shifted into and/or out of the integrated circuit; and
   b) providing the integrated circuit with current surge minimization circuitry, and configuring said currant surge minimization circuitry to be operated during operation of said number of scan chains.

15. A method as in claim 14, wherein said number of scan chains is at least two, and wherein providing the integrated circuit with current surge minimization circuitry comprises providing the Integrated circuit with distinct external inputs for receiving shift signals corresponding to two different ones of said number of scan chains.

16. A method as in claim 14, wherein providing the integrated circuit with current surge minimization circuitry comprises providing the integrated circuit with a shift signal generator, said shift signal generator generating at least a first shift signal which i)is provided to a first of the number of scan chains, and ii) is out-of-phase with at least a second shift signal which is provided to a second of the number of scan chains.

17. A method as in claim 14, wherein providing the integrated circuit with current surge minimization circuitry comprises:
   a) routing a number of gating signal lines to a number of circuit elements of the integrated circuit; and
   b) routing each of said gating signal lines to an external input of the integrated circuit.

18. A method of testing an integrated circuit, comprising:
   a) shifting test data through a number of scan chains of the integrated circuit; and
   b) during at least a portion of said shifting, applying current surge minimization signals to the integrated circuit.

19. A method as in claim 18, wherein applying current surge minimization signals to the integrated circuit comprises applying gating signals to circuit elements of the integrated circuit.

20. A method as in claim 18, wherein applying current surge minimization signals comprises changing the state of at least one current surge minimization signal while said at least one current surge minimization signal is being applied.

21. A method of testing an integrated circuit, comprising:
   a) providing test data to at least two scan chains of the integrated circuit; and
   b) shifting test data through the at least two scan chains in parallel, but out-of-phase, while at least a portion of the test data is being provided to the at least two scan chains.

22. A method as in claim 21, wherein operating the at least two scan chains comprises:
   a) providing at least a first shift signal to a first, but not a second, of the at least two scan chains; and
   b) providing at least a second shift signal to the second, but not the first, of the at least two scan chains;
   wherein the second shift signal is out-of-phase with the first shift signal.

23. A method as in claim 21, wherein operating the at least two scan chains comprises:
   a) providing at least a first shift signal to a first of the at least two scan chains; and
   b) providing at least a second shift signal to a second of the at least two scan chains;
   wherein the first shift signal, the second shift signal, and arty other shift signal provided to the first and second scan chains, are out-of-phase with respect to one another.

* * * * *